United States Patent [19]

Kronlage

[11] 3,909,837

[45] Sept. 30, 1975

[54] HIGH-SPEED TRANSISTOR WITH RECTIFYING CONTACT CONNECTED BETWEEN BASE AND COLLECTOR

[75] Inventor: John William Kronlage, Richardson, Tex.

[73] Assignee: Texas Instruments Incorporated, Dallas, Tex.

[22] Filed: June 7, 1971

[21] Appl. No.: 150,720

Related U.S. Application Data

[63] Continuation of Ser. No. 788,170, Dec. 31, 1968, abandoned.

[52] U.S. Cl. ...................... 357/15; 357/48; 357/40; 357/46

[51] Int. Cl.[2] ...................... H01L 29/48; H01L 29/56; H01L 27/02

[58] Field of Search..... 317/235 UA, 235 Y, 235 D, 317/235 E

[56] References Cited

UNITED STATES PATENTS

| | | | |
|---|---|---|---|
| 3,252,063 | 5/1966 | Ziffer | 317/235 |
| 3,463,971 | 8/1969 | Soshea | 317/235 |
| 3,463,975 | 8/1969 | Biard | 317/235 |

*Primary Examiner*—Martin H. Edlow
*Attorney, Agent, or Firm*—Harold Levine; William E. Hiller; James T. Comfort

[57] ABSTRACT

High-speed logic switching is accomplished by an internal antisaturation clamp comprising a barrier-type rectifying junction between the base electrode and a collector electrode of a junction transistor. Diffusion and metalization techniques are used to fabricate a shallow-base transistor, having a high internal cutoff frequency, and a barrier-type rectifying junction surrounded by a guard ring. The rectifying junction covers a window in a diffusion region for the base electrode over a portion of the collector electrode. A metal film overlays the window to the collector electrode area and extends over a portion of the base electrode, thereby forming a metal-semiconductor barrier-type rectifying junction internally between the base electrode and the collector electrode.

6 Claims, 6 Drawing Figures

INVENTOR
JOHN W. KRONLAGE

BY

ATTORNEY

HIGH-SPEED TRANSISTOR WITH RECTIFYING CONTACT CONNECTED BETWEEN BASE AND COLLECTOR

This is a continuation of application Ser. No. 788,170 filed Dec. 31, 1968, now abandoned.

This invention relates to semiconductor devices, and more particularly to high-speed switching, non-saturable transistor logic circuitry.

Switching circuitry is employed to produce a discrete change of state in a signal that may take the form of a voltage change, a current change, or both. Logic switching may be used to perform logical operations as in a computer, or to transfer energy as in relay drivers and switching regulators. In logic operations, as in a computer, an important consideration is the switching speed of the device, i.e., the time required for the discrete change of state to occur. When transistors are used as the active elements in switching circuitry, a limiting factor with respect to switching speed is the time required to turn on and turn off the collector current in these devices. A transistor cannot change states in zero time. The time interval between initiation and completion of the switching action is a measure of switching speed.

Two static states are considered in transistor switching circuitry, the on state and the off state. The period of time to change a transistor from the off state to the on state, referred to as "rise time," can be minimized by driving the base electrode with fairly large electrical signals. Unfortunately, this tends to drive the transistor into a saturated condition, to the detriment of another factor affecting the switching speed, this being the "storage time."

In saturated switching circuits, the on state is marked by a very low collector voltage and relatively large collector current. The off state is marked by a relatively high collector voltage and a very small collector current. When the transistor is saturated, the collector-base junction is forward biased and the base region stores a large concentration of minority carriers. Before the transistor can be considered turned off, the collector-base junction has to be returned to the usual reverse-bias state. The time period required to return the collector-base junction to the reverse-bias state, referred to as the "storage time," is often the primary limiting factor affecting switching speed. Thus, the operating speed of a logic circuit is often a compromise between using sufficient drive voltage to obtain a fairly short rise time, but yet keeping the device out of saturation to avoid unduly long storage time.

Several techniques have been developed for increasing the switching speed of integrated logic circuits including shunting the collector-base junction with a Schottky barrier diode adapted to conduct in the forward direction at a slightly lower voltage than the collector-base junction to prevent saturation of the transistor. This prevents the collector-base from becoming forward biased, a condition necessary for saturation, and, therefore, avoids storage of a high concentration of carriers in the base. Such a technique is described in the co-pending U.S. application of James R. Biard, Ser. No. 442,774, filed Dec. 31, 1964 now U.S. Pat. No. 3,463,975, and assigned to the assignee of the present invention.

An object of the present invention is to provide high-speed, integrated-circuit, non-saturable switching devices. Another object of the present invention is to provide an integrated logic switching transistor clamped to operate in a non-saturated condition. Still another object of this invention is to provide high-speed, integrated logic circuitry internally clamped in a non-saturable mode.

In one basic configuration of this invention, a semiconductor body is formed having at least two adjacent zones of opposite conductivity type which form at least one P-N junction therebetween, with the two zones extending to at least one surface of the semiconductor body. A metal contact is then formed so as to engage the two zones of opposite conductivity, as well as the P-N junction therebetween, along the one surface of the semiconductor body. The metal contact makes ohmic contact to one of the zones and a rectifying barrier contact to the other zone.

In another configuration of this invention, a semiconductor body is formed having two zones of one conductivity type and one zone of opposite conductivity type to form two P-N junctions respectively between the two zones of one conductivity and the one zone of opposite conductivity. All of the zones extend to at least one surface of the semiconductor body. A metal contact is then formed so as to engage all of the zones and the two P-N junctions along the one surface of the semiconductor body. The metal contact makes ohmic contact to the two zones of one conductivity and a rectifying barrier contact to the one zone of opposite conductivity.

In another configuration of this invention, a base diffusion is made into an N-type material overlaying a semiconductor substrate to form a P-N junction in a semiconductor device. By employing photomask and etch techniques, a window is outlined in the diffusion area to form an opening to the N-type material. A deposition of a metal film through an opening in a silicon dioxide layer overlays the N-type material in the window and extends over a portion of the diffusion, thereby forming a metal-semiconductor barrier-type rectifying junction that conducts in a forward direction at a lower voltage potential that the junction between the diffusion area and the N-type material. There is thus formed in an integrated circuit configuration a metal-semiconductor junction integral with the electrode of a semiconductor device surrounded by a guard ring, the diffusion area.

A more complete understanding of the invention and its advantages will be had by reference to the following specification and claims and from the accompanying drawings illustrative of the invention.

Referring to the drawings.

Although the invention will be described in an integrated transistor circuit configuration, this should not be construed as a limitation thereof. Clamping action may also be desired for other semiconductor devices in integrated or discrete circuit configurations. The internal diode clamp of the present invention may be incorporated in a transistor in a discrete circuit configuration.

Figures 1, 3:
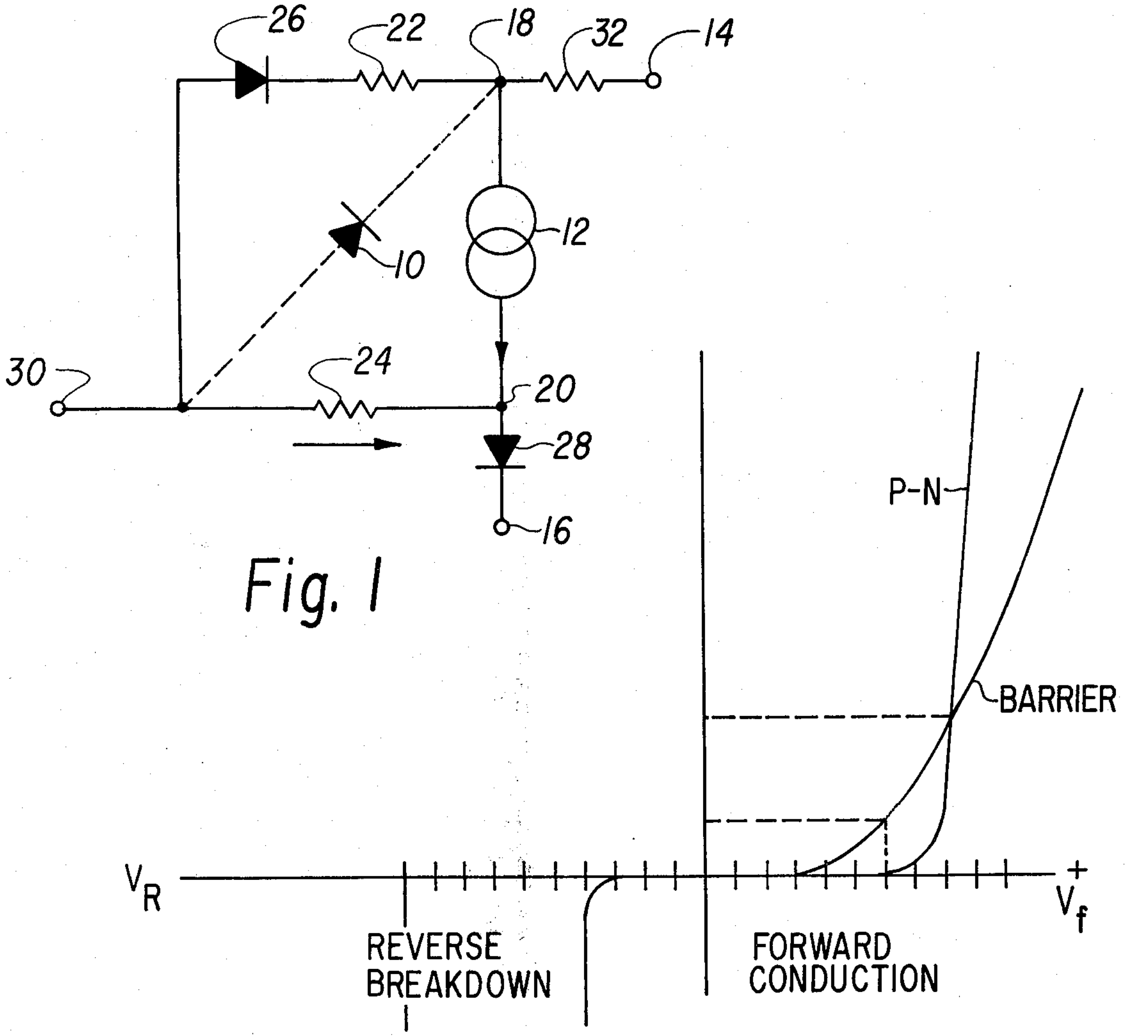
FIG. 1 is an equivalent circuit of a transistor showing the placement of a metal-semiconductor diode in accordance with this invention.
FIG. 3 is a plot of the forward and reverse current versus voltage characteristics of a junction diode and a metal-barrier diode.

Referring to the drawings, FIG. 1 is an equivalent circuit of a transistor including a barrier-type diode 10 internal within the structure of a p-n junction transistor. The reference number 12 indicates a current source path when the transistor is turned on and conducting from a collector electrode terminal 14 to an emitter electrode terminal 16. A junction 18 represents the collector node of the transistor and the junction 20 represents the base node. Resistors 22 and 24 represent, respectively, the collector-base resistance and the emitter-base resistance. In the usual manner, a transistor is considered to have a collector-base junction, indicated by the diode 26, and an emitter-base junction, indicated by the diode 28.

Figure 2:
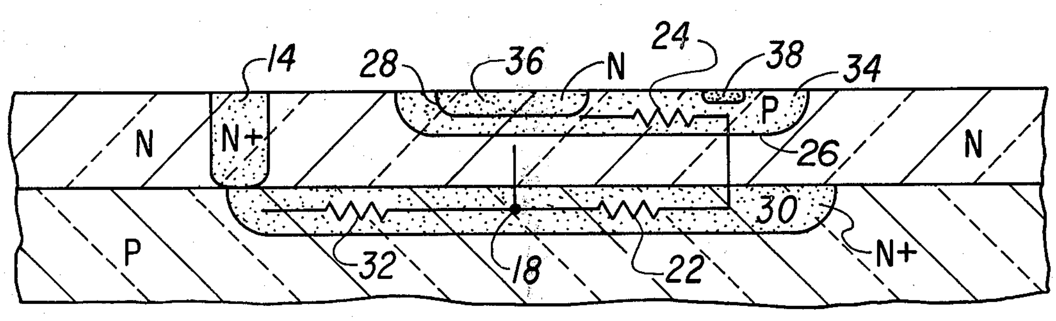
FIG. 2 is an elevational view of a non-clamped transistor illustrating the vertical geometry and parasitic device resistances.

Referring to FIG. 2, there is shown a vertical section of a transistor without the clamping diode 10. The collector node 18 is located in a collector region 30, the impurity concentration of which determines the resistance 22. In addition, the impurity concentration of the region 30 determines the value of a resistor 32 between the node 18 and the terminal 14. The p-n interface between the regions 30 and 34 produces the rectifying junction 26 and an n-p interface between the regions 34 and 36 establishes the rectifying junction 28. To complete the comparison between the equivalent circuit of FIG. 1 with the actual transistor of FIG. 2, the impurity concentration of the region 34 will establish the value of the resistor 24 and a terminal region 38 provides a means for making an electrical connection to the base electrode.

When a voltage at the base electrode terminal 38 exceeds the threshold level, the base-emitter junction 28 becomes forward biased, thereby turning on the transistor and a current flows from the source 12. A voltage in excess of the threshold level will also result in the collector-base junction 26 being forward biased; the transistor is then operating in a saturated mode. In a saturated mode, the base region stores a large concentration of minority carriers which must be swept out before the transistor can be turned off. Saturation of the transistor of FIG. 2 can be prevented by maintaining the collector electrode at a level to prevent forward biasing of the collector-base junction; that is, at a level above the collector-emitter saturation voltage, $V_{CE\text{-}Sat}$.

In accordance with this invention, the clamping diode 10 conducts when the base drive to the transistor exceeds a predetermined value. Because of its lower forward drop, the diode 10, rather than the diode 26, shunts excess base drive current to the collector node 18. The foremost advantage of including the clamping diode 10 internally within the collector-base region is to decrease the switching time of the circuit, permitting operation of a digital system at greater speeds. This decrease is due to the elimination of minority carrier storage in the base region 34 of the transistor. As a result, the base can be driven with a large signal at the terminal 38 to minimize the delay time and rise time, but the transistor cannot be saturated because the collector-base junction 26 will not have a full forward voltage applied, the diode 10 tending to conduct at a lower voltage. The recovery time of the diode 10 is virtually nonexistent since it is a majority carrier device. Another important advantage gained by placing the diode 10 within the collector-base region is to relieve the field stress points at the outer diode perimeter which are the result of reverse biasing diodes not having a guard ring.

The operation of the clamping diode 10 may be more easily understood by referring to FIG. 3 where there is shown a plot of forward and reverse characteristics of a p-n junction, such as diode 26, and a metal-semiconductor diode, commonly referred to a Schottky barrier diode. Considering only the forward diode characteristics, the barrier junction begins to conduct at a somewhat lower voltage than a p-n junction. At a forward voltage less than the cross-over point, the barrier junction will be conducting and the p-n junction nonconducting. Thus, by paralleling the inherent p-n junction of a transistor with a barrier rectifying junction, or Schottky barrier diode, saturation of the transistor can be prevented.

Figure 4:
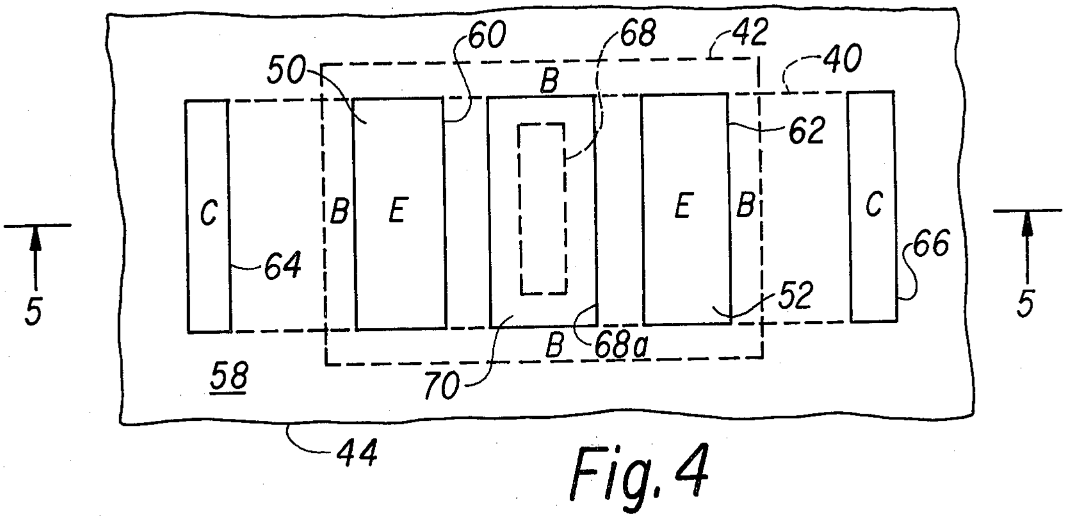
FIG. 4 is a plan view of an integrated semiconductor transistor including a metal-semiconductor diode clamp between the base electrode and collector electrode.
Figure 5:
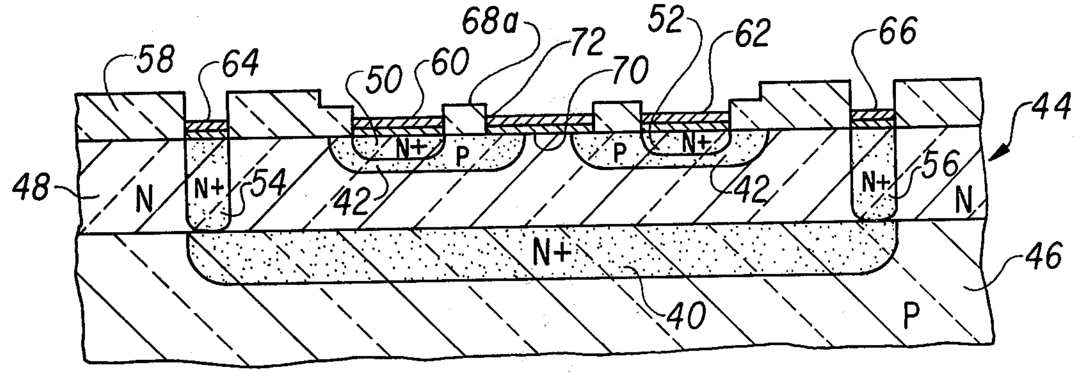
FIG. 5 is a sectional view of the integrated circuit transistor of FIG. 4 taken along the line 5—5.

Referring to FIGS. 4 and 5, there is shown a semiconductor device which comprises an n-p-n-epitaxial transistor of a planar configuration. The transistor includes a metal-semiconductor diode formed in an opening to the collector region 40 through a window 68 in a base region 42 shunting the collector and base electrodes as illustrated by the equivalent circuit configuration shown in FIG. 1. In this illustrative embodiment, the device comprises a silicon wafer 44 which includes a substrate 46 lightly doped with acceptor impurities and an epitaxially grown layer 48 lightly doped N-type. Prior to forming the epitaxially grown layer 48, the buried layer $N^+$-region 40 was fabricated by a diffusion technique. The base region 42 is formed in the epitaxial layer by selective diffusion of acceptor impurities, and emitter regions 50 and 52 are defined within the base region by a selective N-type diffusion. Electrical contact is made to the collector region 40 through $N^+$-type diffusion channels 54 and 56. A silicon dioxide coating 58 covers the top surface of the wafer, except where contacts are made, and it will be noted that this dioxide coating is in a stepped configuration due to oxide removal for the deposition and diffusion steps performed in making the base and emitter regions using silicon dioxide masking. Emitter contacts are provided on the transistor wafer by a metalization step that forms the contacts 60 and 62 which make non-rectifying connection to the silicon surface of the emitter regions 50 and 52, respectively. In like manner, collector contacts 64 and 66 make non-rectifying contact to the collector region 40 in openings formed in the oxide layer.

In forming the base region 42, a rectangular section of the oxide layer within the base region was not removed. This produced a window 68 in the base region which exposed a portion of the collector region 40 when openings were formed in the dioxide layer for the contacts A metal-semiconductor diode 70 is provided at the surface of the collector region exposed through the window 68 by a metallic pad 72 which engages the surface of the collector region and extends over a portion of the base region through an opening formed in the dioxide layer 58. That portion of the pad 72 over the base region 42 makes ohmic connection thereto, and so the diode 70 formed at the interface between the metal pad 72 and the collector region shunts the base to collector of the transistor, as illustrated in FIG. 1. Note, that this diode is connected internally with respect to the base and collector electrodes. High-field stress points are eliminated by extending the pad 72 over the base region 42.

It is important to note that the same metal film makes non-rectifying contacts 60, 62, 64 and 66 and also makes a non-rectifying contact to the base region, but yet makes rectifying connection to the collector region through the window 68. This is possible when the contacts are composed of metals such as aluminum or molybdenum.

Electric contact to the emitter, base and collector regions may be made by metalizing aluminum over the silicon dioxide layer 58. In silicon devices, aluminum has been found to be preferable as the contact metal. A typical metalizing sequence for metalizing aluminum includes cutting the contact openings in the layer 58 by a photo-resist technique. The complete unit is placed in a bell jar under a tungsten filament coiled around a charge of aluminum. Alternately, the aluminum charge may be the target for an electron gun apparatus housed in the bell jar. In either case, after the bell jar has been evacuated, the aluminum is vaporized by heating from the filament or bombardment by the electron beam. A photo-resist step then is carried out which serves to form the metallized contact areas. In order to assure a good ohmic contact, it is desirable to have an impurity surface concent ration under the aluminum contacts in excess of $2 \times 10^{20}$ atoms/cm$^3$. Boron and phosphorus are examples of impurities that may be diffused into the base 42 and emitter regions 50 and 52, respectively. The collector regions 54, 56, being of the same polarity as the emitter region, is subjected to an emitter diffusion in areas eventually used for ohmic contact. The collector region in the area of the window 68 is of a low concentration epitaxial material, however, and a rectifying connection is made by the aluminum in this area, even though formed by the identical process and simultaneously with the non-rectifying contacts.

In another embodiment, the contacts are composed of two layers of metal, a lowermost layer of molybdenum and a top layer of gold. Molybdenum does not alloy with silicon at temperatures ordinarily used in manufacture, it adheres reasonably well to silicon and silicon dioxide, it does not alloy with and is not penetrated by gold, and it can be selectively applied with the evaporation and photo-resist masking techniques ordinarily used in semiconductor manufacture. Gold is ideal for the top layer because it is highly conductive so that series resistance is not introduced, it adheres to molybdenum, and it can be easily bonded to with the commonly-used small gold wires. For high impurity concentrations at the silicon surface, above about $10^{20}$ atoms/cc, the molybdenum will make low-resistance ohmic contact. This high surface concentration is ordinarily present at least at the surface of the base and emitter regions 42, 50 and 52 and the heavily doped collector regions 54 and 56 of the transistor described above due to the diffusion techniques used in manufacture, and so non-rectifying connection is made by the pads 60, 62, 64 and 66. The collector region in the area of the window 68 is of low concentration epitaxial material, however, and rectifying connection is made by the same metal, molybdenum, under the pad 72, even though this part of the molybdenum layer is formed identically with the other parts.

Figure 6:
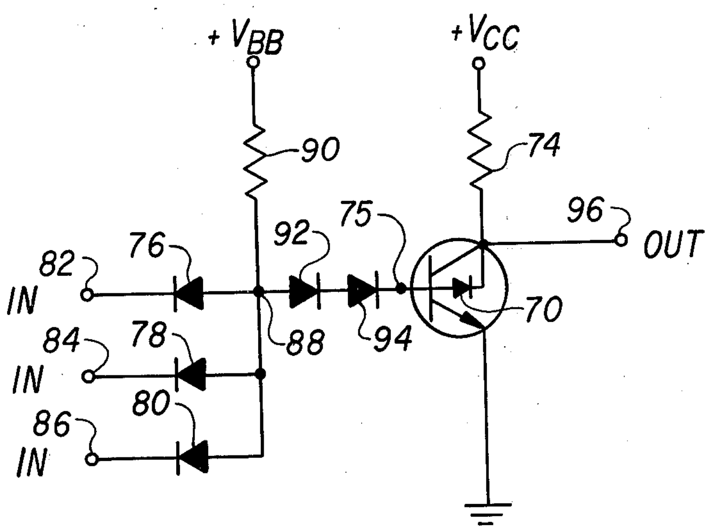
FIG. 6 is a schematic diagram of a digital logic circuit utilizing the transistor-diode device of this invention.

An example of a circuit in which the device of this invention is utilized to advantage is illustrated in FIG. 6. This is a gate circuit with three inputs, being of the so-called "diode transistor logic" form. The transistor-diode combination of FIGS. 1, 4 and 5 is used as an inverting amplifier, the emitter 16 being grounded and the collector being connected through a load resistor 74 to a positive supply +Vhd CC. A diode gate portion of the circuit includes three p-n junction diodes 76, 78 and 80 connected separately to three logic inputs 82, 84 and 86. The input diodes have a common anode portion 88 which is connected through a resistor 90 to bias supply $+V_{BB}$ and further connected through two diodes 92 and 94 to the base of the inverting transistor. The diodes 76, 78 and 80 preferably have a fast recovery time, whereas the diodes 92 and 94 should have a slow recovery time.

In operation, this circuit functions as an inverting AND gate or "NAND" gate, if a positive voltage is assumed to be a "1" in the binary system. With a "1" present at each of the inputs 82, 84 and 86 the diodes 76, 78 and 80 will be back biased and the combination of the supply $+V_{BB}$ and the resistor 90, acting as a current source, will apply base current to the terminal 75, turning on the transistor. This will produce a low voltage, or low current, at an output terminal 96. On the other hand, if any one of the inputs 82, 84 and 86 have a "0" or low voltage thereon, the associated one of the diodes 76, 78 or 80 will conduct the current from the resistor 90, the base current for the transistor will be essentially zero, and the voltage at the output 96 will be high. Since the output 96 of one of these circuits would ordinarily drive an input 82, 84 or 86 of a like circuit, the two diodes 92 and 94 are needed in series to insure that the current from the resistor 90 will flow out of an input terminal 82, 84 and 86 and through the collector-emitter of a turned-on transistor in a preceding circuit rather than into the base of the transistor of the unit shown, the forward drop across the two diodes being, of course, twice that of a single input diode, if all diodes are of the same material. The input diodes may be also of the metal-semiconductor type as set forth below.

A method of making the device of FIGS. 4 and 5 will now be described. The starting material is a slice of silicon of which the wafer 44 is at this point merely a very small undivided segment. The slice comprises a substrate 46 of low concentration, high resistivity P-type silicon with the epitaxial layer 48 having been formed thereon with a resistivity of perhaps 0.2 Ω-cm. The particular resistivity used for the epitaxial layer is rather important, it being necessary that the impurity concentration be low enough so that the aluminum or molybdenum makes rectifying contact thereto instead of ohmic, creating a metal-semiconductor diode, but yet the resistivity should not be too high because series resistance between the diode and the area actually functioning as the collector would be too great. Thus, the resistivity of the epitaxial layer is a compromise between these factors.

A silicon diode coating is formed on the epitaxial layer of the starting material, either by thermally growing oxide at a high temperature or by decomposition of ethyl-orthosilane or silane by a low temperature deposition technique.

After diffusion of an isolation ring and the channels 54 and 56, an opening is made in the layer 58 by photoresist techniques, and a P-type diffusion is performed using boron as the impurity, creating the base region 42. A thin layer of thermal oxide forms over the base region during the deposition process for this base diffusion. Another opening is made in the oxide layer 58 by photoresist masking and etching, then an N-type diffusion is performed to define the emitter regions 50 and 52. Openings are now formed in the oxide coating by photoresist masking and etching for the purpose of making ohmic contacts to the heavily doped material where the emitter and collector contacts are to be applied, while at the same time the opening 68*a* is defined over the lightly doped epitaxial material to accommodate the diode 70. After suitable surface cleaning, a film of aluminum or molybdenum of perhaps 10$\mu$ to 20$\mu$ thickness is deposited on the entire top surface by evaporation. If molybdenum is used, then a film of gold is deposited onto the molybdenum. The desired pattern of contacts is then defined by photoresist masking and the excess metal is removed by etching to leave the metalized areas defining the various contacts.

It is to be understood that the foregoing detailed description of this invention is illustrative and not limitative. For example, other metal films may be used in lieu of those disclosed. Utilization of known methods, processes and techniques for making semiconductor devices is also contemplated for producing a device having the novel characteristics set forth herein.

While only one embodiment of the invention, together with modifications thereof, has been described in detail herein and shown in the accompanying drawings, it will be evident that various further modifications are possible without departing from the scope of the invention.

What is claimed is:

1. A semiconductor device comprising: a body of semiconductor material of one conductivity type and of relatively high resistivity, said body comprising the collector region of a transistor, a first region of opposite conductivity type to said body provided in one surface of said body, said first region comprising the base region of the transistor, a second region of said one conductivity type provided within a portion of said first region, said second region comprising the emitter region of the transistor, said first region and said second region emerging at said one surface of said body at adjacent positions, said body including a zone emerging at said one surface of said body, the lateral periphery of said zone being completely bounded by said first region and being disposed in contiguous relationship therewith, a metal contact disposed on said zone and partially on said first region but spaced from said second region, said metal contact establishing an ohmic contact with said first region and a rectifying barrier contact with said zone to define a metal-semiconductor junction integral with the collector region of the transistor providing an internal antisaturation clamp therefor to increase the switching speed of the transistor.

2. A semiconductor device as set forth in claim 1, wherein a pair of said second regions of said one conductivity type are provided within said first region in spaced apart relationship to define respective emitter regions of the transistor, and said zone of said body being located between said pair of second regions in spaced relationship with respect thereto.

3. A semiconductor device as set forth in claim 2, wherein said pair of second regions and said zone of said body are elongated and are arranged in parallel relationship extending transversely with respect to said first region.

4. A semiconductor device as set forth in claim 3, further including a substrate of semiconductor material, said body comprising an epitaxial layer formed on said substrate, said substrate including a substrate region of said one conductivity type and of relatively low resistivity, and said body including a pair of diffusion channels therethrough emerging at said one surface of said body at opposite ends of said first region, said diffusion channels being of said one conductivity type and of relatively low resistivity and in respective contacting relation to said substrate region.

5. A semiconductor device as set forth in claim 4, further including metal contacts establishing respective ohmic contacts with said pair of second regions and said pair of diffusion channels of said one conductivity type of relatively low resistivity.

6. A semiconductor device as set forth in claim 1, wherein said one conductivity type semiconductor material is N type material and said opposite conductivity type semiconductor material is P type material such that said collector, base, and emitter regions define an NPN transistor.

* * * * *